US011509116B2

(12) United States Patent
Vermeulen et al.

(10) Patent No.: US 11,509,116 B2
(45) Date of Patent: Nov. 22, 2022

(54) ATHERMAL ANGULAR OUTPUT BY COMBINING A LASER WITH A GRATING BASED ANTENNA

(71) Applicant: Analog Photonics LLC, Boston, MA (US)

(72) Inventors: Diedrik Vermeulen, Boston, MA (US); Patrick Callahan, Boston, MA (US); Michael Watts, Hingham, MA (US); Ehsan Hosseini, Milton, MA (US); Christopher Vincent Poulton, Cambridge, MA (US)

(73) Assignee: Analog Photonics LLC, Boston, MA (US)

( * ) Notice: Subject to any disclaimer, the term of this patent is extended or adjusted under 35 U.S.C. 154(b) by 528 days.

(21) Appl. No.: 16/656,896

(22) Filed: Oct. 18, 2019

(65) Prior Publication Data

US 2020/0127432 A1 Apr. 23, 2020

Related U.S. Application Data

(60) Provisional application No. 62/749,124, filed on Oct. 23, 2018.

(51) Int. Cl.
*H01S 3/00* (2006.01)
*H01S 5/14* (2006.01)
(Continued)

(52) U.S. Cl.
CPC ............ *H01S 5/141* (2013.01); *G02B 5/1861* (2013.01); *G02B 27/4233* (2013.01);
(Continued)

(58) Field of Classification Search
CPC .... H01S 5/141; H01S 3/0071; H01S 3/08009; H01S 3/08059; H01S 5/005;
(Continued)

(56) References Cited

U.S. PATENT DOCUMENTS 6,636,536 B1   10/2003  Tisue
10,048,208 B2 *  8/2018  Rothberg ............. C12Q 1/6869
(Continued)

OTHER PUBLICATIONS

Peral et al., "Generalized Bloch Wave Analysis for Fiber and Waveguide Gratings", Journal of Lightwave Technology, vol. 15, No. 8, pp. 1295-1302, Aug. 1997.
(Continued)

*Primary Examiner* — Xinning(Tom) Niu
(74) *Attorney, Agent, or Firm* — Young Basile Hanlon & MacFarlane, P.C.

(57) ABSTRACT

An internal laser component of an optical device comprises: a waveguide that defines a guided mode of a first optical wave characterized by a first propagation constant associated with a first effective refractive index. An optical antenna grating comprises: a waveguide that defines a guided mode of a second optical wave characterized by a second propagation constant associated with a second effective refractive index, and a grating structure configured to emit a portion of the second optical wave in a selected direction. The internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

24 Claims, 12 Drawing Sheets

(51) Int. Cl.
*H01S 3/08* (2006.01)
*G02B 5/18* (2006.01)
*G02B 27/42* (2006.01)
*H01S 5/00* (2006.01)
*G01S 7/481* (2006.01)

(52) U.S. Cl.
CPC ........ *H01S 3/0071* (2013.01); *H01S 3/08009* (2013.01); *H01S 3/08059* (2013.01); *H01S 5/005* (2013.01); *G01S 7/4814* (2013.01)

(58) Field of Classification Search
CPC ...... H01S 5/0225; H01S 5/0014; H01S 5/142; G02B 5/1861; G02B 27/4233; G01S 7/4814
See application file for complete search history.

(56) References Cited

U.S. PATENT DOCUMENTS

| | | | |
|---|---|---|---|
| 2009/0263083 A1* | 10/2009 | Nicholson | H01S 3/06708 385/37 |
| 2014/0153601 A1* | 6/2014 | Doerr | H01S 5/125 372/44.01 |
| 2015/0249321 A1* | 9/2015 | Chen | G02B 6/124 372/45.01 |
| 2016/0248225 A1* | 8/2016 | Sayyah | H01S 5/1064 |
| 2016/0315452 A1* | 10/2016 | Chen | H01S 5/1032 |

OTHER PUBLICATIONS

Silberstein et al., "Use of grating theories in integrated optics", J. Opt. Soc. Am. A, vol. 18, No. 11, pp. 2865-2875, Nov. 2001.
Cao et al., "Stable and efficient Bloch-mode computational method for one-dimensional grating waveguides", J. Opt. Soc. Am. A, vol. 19, No. 2, pp. 335-338, Feb. 2002.
Lalanne et al., "Fourier-modal methods applied to waveguide computational problems", Optics Letters, vol. 25, No. 15, pp. 1092-1094, Aug. 1, 2000.

* cited by examiner

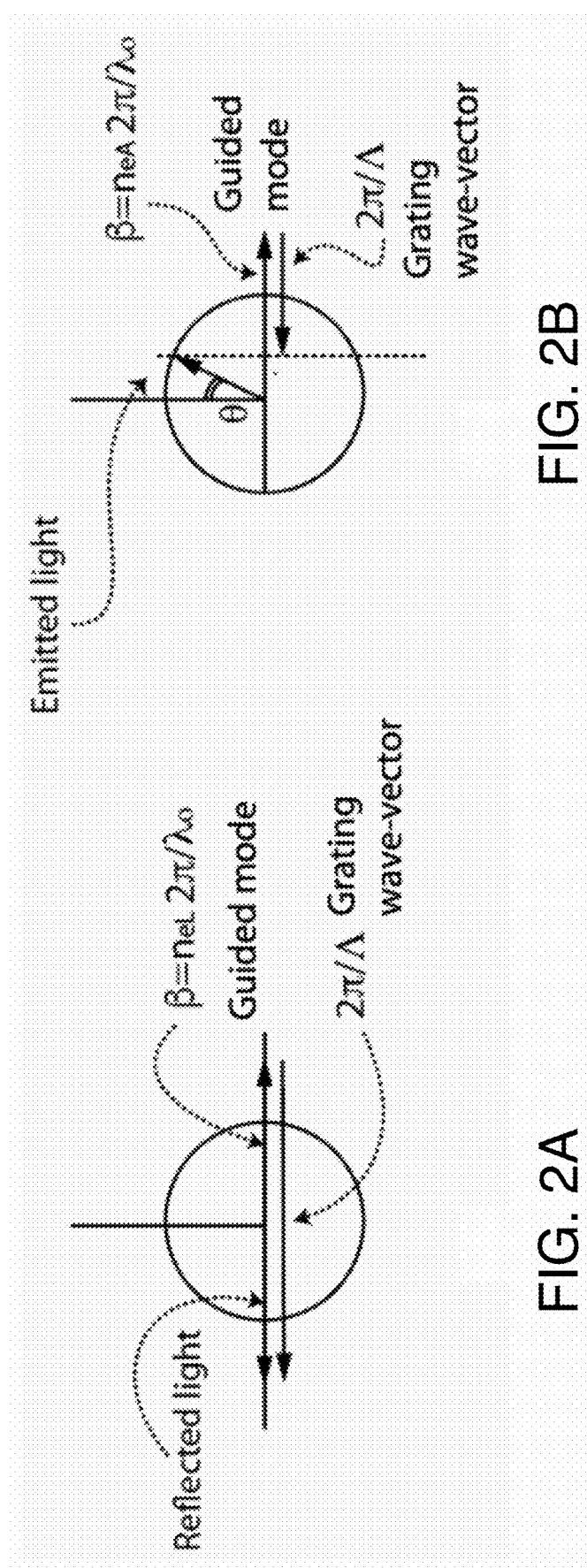

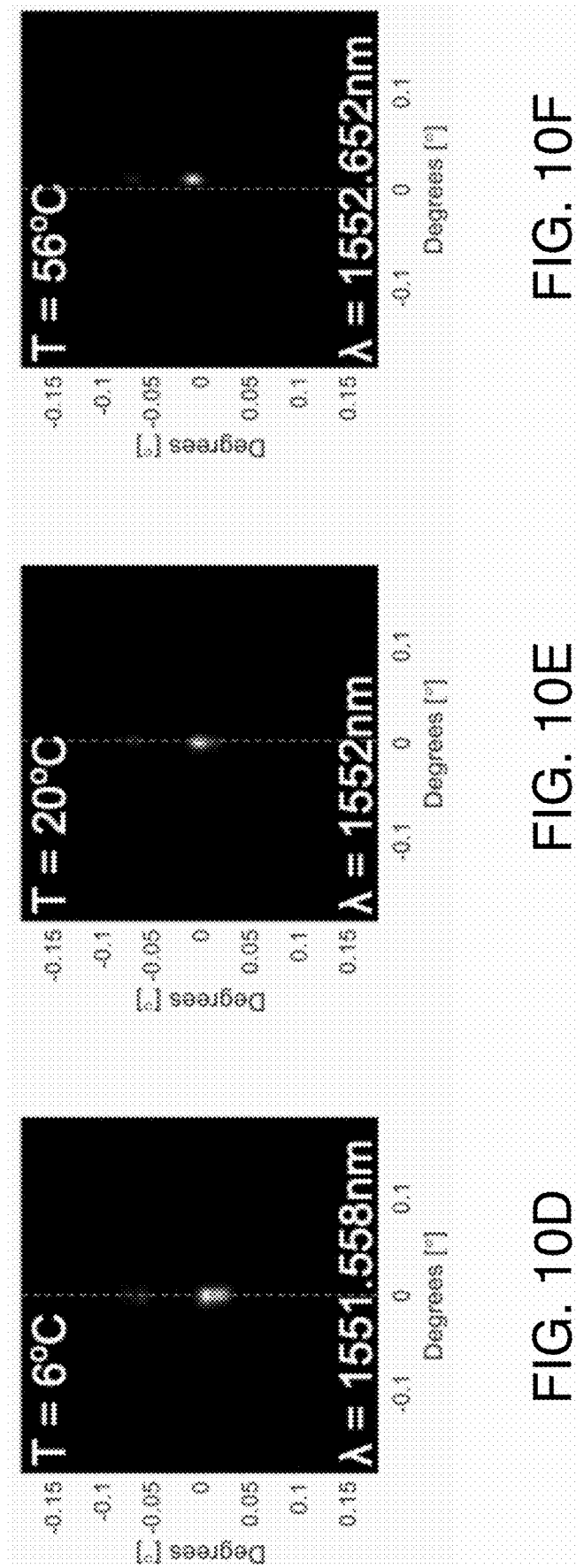

ATHERMAL ANGULAR OUTPUT BY COMBINING A LASER WITH A GRATING BASED ANTENNA

CROSS-REFERENCE TO RELATED APPLICATION(S)

This application claims priority to and the benefit of U.S. Provisional Patent Application Ser. No. 62/749,124, filed Oct. 23, 2018, the entire disclosure of which is hereby incorporated by reference.

TECHNICAL FIELD

This disclosure relates to athermal angular output by combining a laser with a grating based antenna.

BACKGROUND

Solid-state LiDAR using optical phased arrays (OPAs) in combination with semiconductor lasers is useful for applications requiring low-cost high-performance LiDAR solutions. On-chip OPA architectures typically use optical phase shifters for the phase control of each element and long weak gratings (so-called optical antenna gratings) to couple out the light out-of-plane. As these optical antenna gratings couple light out diffractively, light can be steered over different output angles by changing the wavelength. These optical antenna gratings can be fabricated in materials in which the refractive index changes as a function of temperature. Therefore, when the optical antenna grating temperature is changed, the output angle from the optical antenna grating will change according to the Bragg condition, which may represent undesired temperature-dependence for some applications.

SUMMARY

In one aspect, in general, an optical device comprises: a laser gain medium; an internal laser component comprising: a waveguide that defines a guided mode of a first optical wave, wherein the first optical wave is characterized by a first propagation constant associated with a first effective refractive index; and an optical antenna grating, the optical antenna grating comprising: a waveguide that defines a guided mode of a second optical wave, and a grating structure configured to emit a portion of the second optical wave from the optical antenna grating in a selected direction, wherein the second optical wave is characterized by a second propagation constant associated with a second effective refractive index. The internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

Aspects can include one or more of the following features.

The internal laser component further comprises a laser filter structure configured to reflect or transmit a portion of the first optical wave to propagate through the laser gain medium.

The laser filter structure comprises a laser grating.

The laser grating comprises a cavity reflector of a laser cavity that circulates the first optical wave through the laser gain medium.

A common grating structure comprises both a grating structure of the laser grating and the grating structure of the optical antenna grating.

A grating structure of the laser grating and the grating structure of the optical antenna grating are physically separate structures.

The optical antenna grating is outside a laser device that comprises the laser gain medium and the laser grating.

A period of the grating structure of the optical antenna grating is approximately a multiple of a period of a grating structure of the laser grating.

The period of the grating structure of the optical antenna grating is approximately twice the period of the grating structure of the laser grating.

The relationship between the first effective refractive index and the second effective refractive index is approximately given by $$\Lambda_2 \frac{\partial n_2}{\partial T} = 2\Lambda_1 \frac{\partial n_1}{\partial T},$$

where $n_1$ is the first effective refractive index, $n_2$ is the second effective refractive index, $\Lambda_1$ is a period of the grating structure of the laser grating, $\Lambda_2$ is a period of the grating structure of the optical antenna grating, and T is the temperature of the thermal environment.

The laser filter structure comprises at least one ring resonator in a laser cavity that includes the laser gain medium.

The internal laser component comprises at least one segment of a material in a laser cavity that includes the laser gain medium.

The selected direction is substantially insensitive to a change in a temperature of the thermal environment due to a temperature dependent change in the selected direction associated with the optical antenna grating being at least partially compensated by a temperature dependent wavelength shift in the optical device associated with the laser filter.

The selected direction is substantially perpendicular to a direction of propagation of the second optical wave within the optical antenna grating.

In another aspect, in general, a method of fabricating an optical device, the method comprises: forming a laser gain medium; forming an internal laser component comprising: a waveguide that defines a guided mode of a first optical wave, wherein the first optical wave is characterized by a first propagation constant associated with a first effective refractive index; and forming an optical antenna grating, the optical antenna grating comprising: a waveguide that defines a guided mode of a second optical wave, and a grating structure configured to emit a portion of the second optical wave from the optical antenna grating in a selected direction, wherein the second optical wave is characterized by a second propagation constant associated with a second effective refractive index. The internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

In another aspect, in general, a method of operating an optical device, the method comprises: pumping a laser gain medium; coupling a first optical wave between an internal laser component and the laser gain medium, the internal laser component comprising: a waveguide that defines a guided mode of the first optical wave, wherein the first optical wave is characterized by a first propagation constant associated with a first effective refractive index; and emitting a portion of a second optical wave from an optical antenna grating, the optical antenna grating comprising: a waveguide that defines a guided mode of the second optical wave, and a grating structure configured to emit the portion of the second optical wave from the optical antenna grating in a selected direction, wherein the second optical wave is characterized by a second propagation constant associated with a second effective refractive index. The internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

Aspects can have one or more of the following advantages.

The laser/antenna compensation techniques described herein can mitigate potential problems associated with the change of the output angle of the optical antenna grating as a function of temperature. By choosing the appropriate laser filter and optical antenna grating combination, the combined system can achieve a zero or near-zero angular change in optical beam output as a function of temperature.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 2A and 2B are plots illustrating phase matching conditions associated with the laser grating and the emitter grating, respectively.

FIGS. 10D-10F are images showing beam emission for a system configuration with laser/emitter compensation.

DETAILED DESCRIPTION

The OPA-based systems described herein provide a laser filter and an optical antenna grating that are designed in a way that any temperature-dependent change in the optical antenna grating output angle is compensated by a wavelength shift from the laser due to an identical or similar temperature-dependent change in the laser filter. This compensation technique can be achieved using several laser-antenna combinations, as described in more detail below. Some examples of such laser-antenna combinations combine a laser filter and an optical antenna grating that each has an identical or similar:

1) effective refractive index of the Bloch mode, and
2) change in effective refractive index of the Bloch mode as a function of temperature.

The laser filter can use any of a variety of filter types such as a grating (including a Bragg grating reflector, an echelle grating, or an arrayed waveguide grating), a micro-ring resonator, a Mach-Zehnder interferometer, or a multi-mode interferometer. In some implementations, the laser filter comprises a grating that is also used as a cavity reflector. In some implementations, a common grating structure serves as both the laser filter (as a grating-based filter) and the optical antenna grating. In some implementations, the laser filter comprises a wavelength dependent filter inside the laser cavity, and a separate optical antenna grating outside the laser cavity is used for the out-of-plane diffraction. In some implementations, if the conditions described herein are fulfilled, the output angle change as a function of temperature is substantially compensated for light that is emitted vertically out-of-plane and to a large degree for light emitted near-vertically. The implementation of laser architectures that incorporate the laser filter within the laser (e.g., within a round-trip optical path of a linear cavity arrangement, or a ring-shaped cavity arrangement), and optical antenna grating architectures that receive and emit light from the laser, can use any of a variety of physical materials and arrangements of those physical materials. For example, any type of material can be used, or a combination thereof, such as silicon, silicon nitride, oxide, III/V semiconductor, . . . etc.

Figure 1A:
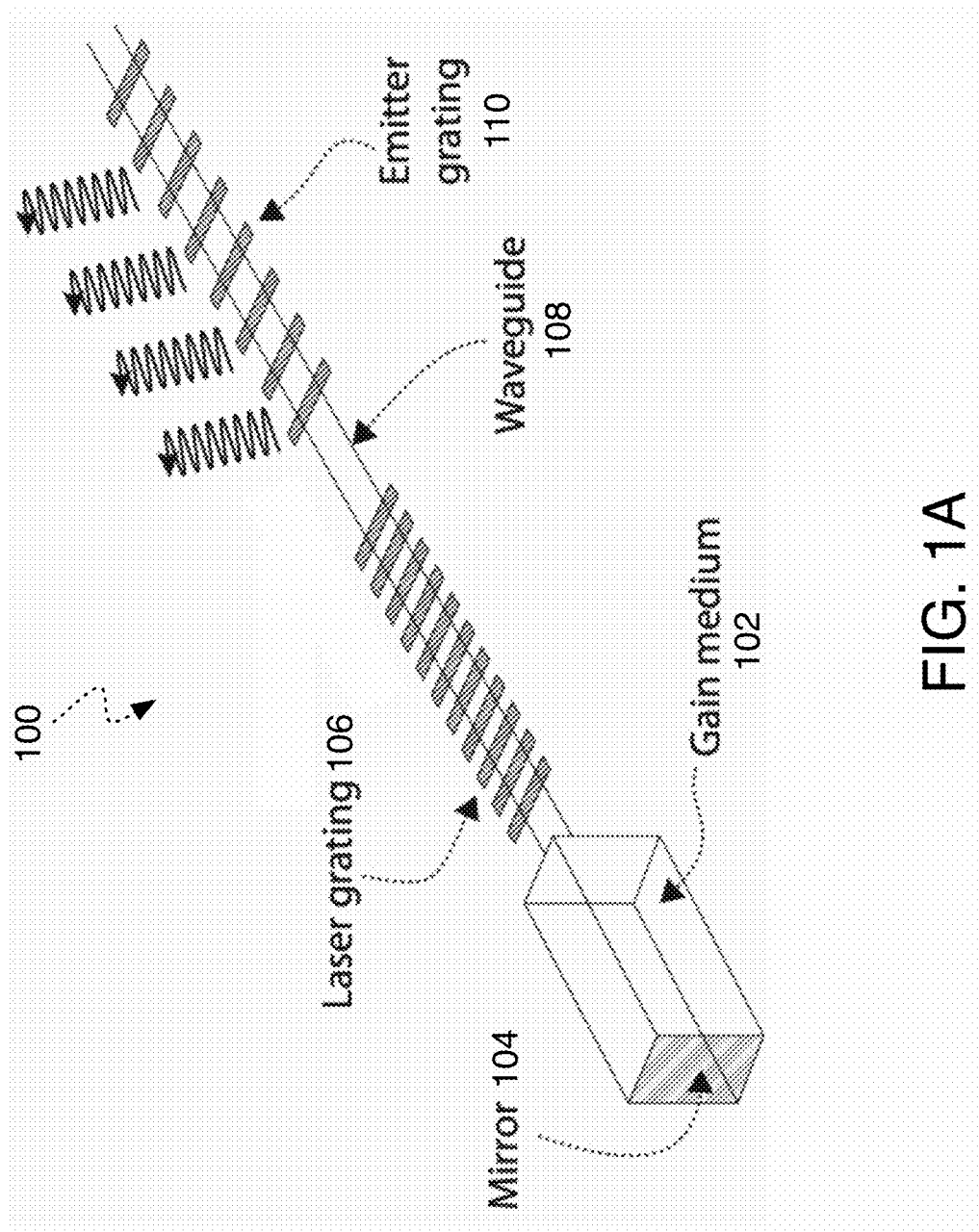
FIGS. 1A and 1B are schematic diagrams of a laser and optical antenna grating system.
Figure 1B:
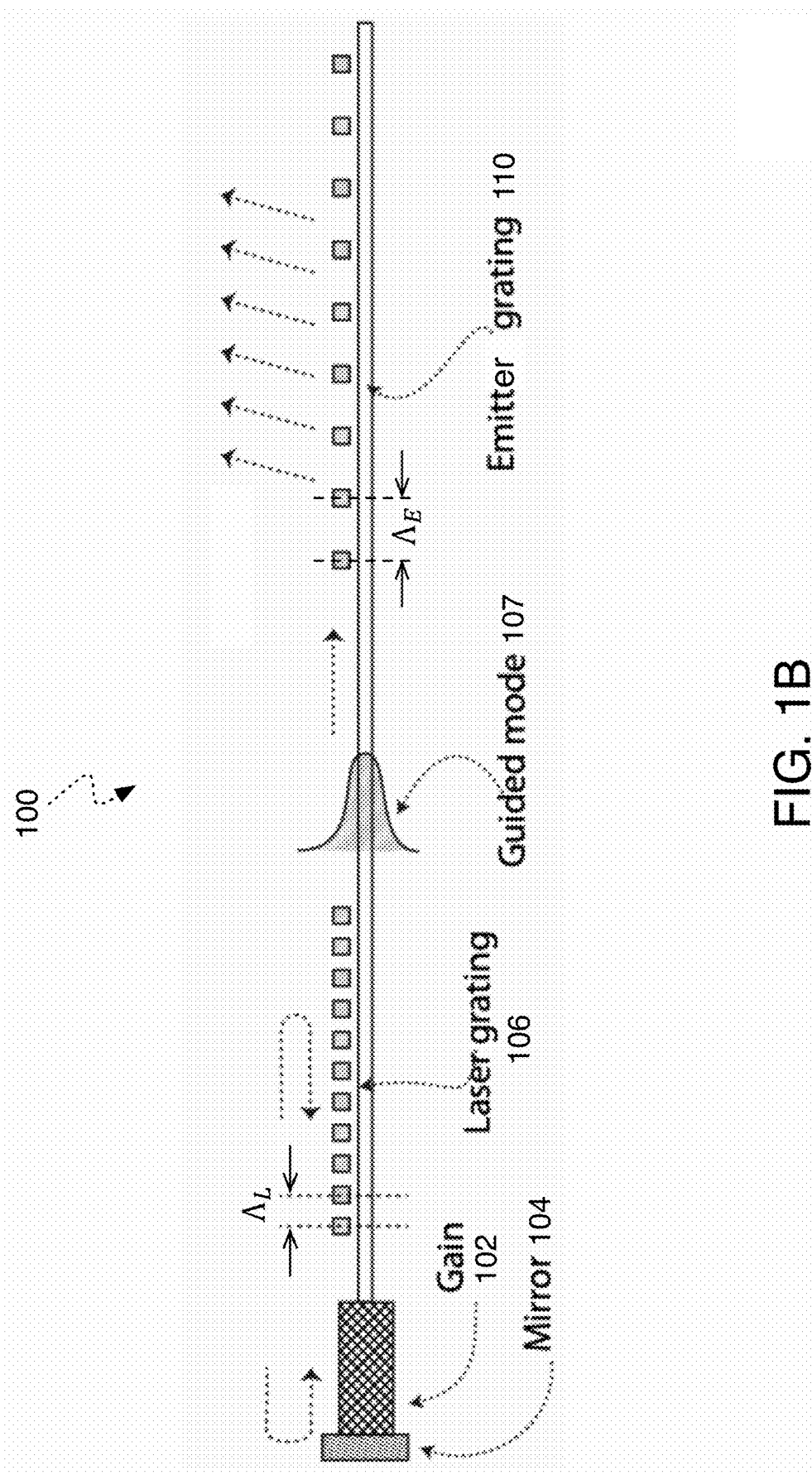

The structure of an example laser and optical antenna grating system 100 is shown in FIGS. 1A (in an oblique view) and 1B (in a side view). In this example, a laser is formed by placing a gain medium 102 between a mirror 104, formed on an end surface of the gain medium 102, and a laser grating 106, which has a frequency-dependent Bragg condition for reflecting light back into the laser and therefore also serves as a frequency-dependent laser filter. Output light from the laser is guided in a waveguide 108 and emitted by an optical antenna grating (also called the "emitter grating") 110. The laser configuration and the overall shape of the gratings can vary but, in some implementations, one design feature is the presence of the laser grating 106 that determines the laser resonance (hence the wavelength of the generated coherent stimulation emission), and the emitter grating 110 that determines the direction of emission. FIG. 1B shows a view of the laser and optical antenna grating system 100 that illustrates light within the laser circulating between the mirror 104 and the laser grating 106, which determines the resonance spectrum, and light being emitted from the emitter grating 110, which determines the emission angle. In this example, the period of the laser grating 106 has been shown as being shorter than the period of the emitter grating 110 (though not necessarily drawn to scale).

FIG. 2A shows the phase matching condition for the laser grating 106. If the effective refractive index of the guided mode in the laser grating region is $n_L$ and the laser grating period is $\Lambda_L$, then the laser wavelength can be approximated as: $\lambda_L = 2\Lambda_L n_L$ where $\lambda_L$ is the wavelength of the laser light in vacuum. The factor of two is based on the assumption that the reflection creating the laser is at the grating's first diffractive reflection peak in which $K_L=2\pi/\Lambda_L=2\beta_L$. Here, $\beta_L$ is the propagation constant of light in the laser grating region, $\beta_L=2\pi n_L/\lambda_L$.

FIG. 2B shows the phase matching condition for emission at the emitter grating 110. The circle shows the propagation constant of the light in vacuum ($k=2\pi/\lambda_L$). If the propagation constant of the light in the emission region is $\beta_E=2\pi n_E/\lambda_L$, and the grating propagation constant is $K_E=2\pi/\Lambda_E$, then the emission angle (into vacuum) can be written as:

$$\sin(\theta) = \frac{\beta_E - K_E}{k} = \frac{(2\pi n_E/\lambda_L) - (2\pi/\Lambda_E)}{2\pi/\lambda_L} = n_E - \frac{1}{\Lambda_E}\lambda_L \quad (1)$$

where the effective refractive index in the emitter region ($n_E$) and the laser wavelength are both functions of temperature and can be written as $n_E(T, \lambda_L)$ and $\lambda_L(T)$, where $T$ is the temperature of the chip on which the laser grating 106 and emitter grating 110 are formed (or other thermal environment in which the laser grating 106 and emitter grating 110 are thermally coupled). The dependence of $n_E$ on temperature is twofold: the refractive index of the guiding material, cladding, and the grating perturbations change with temperature and change the overall effective refractive index of the guided mode; and also, at the same time, the shift in the laser wavelength (due to temperature as well) can change the effective refractive index of the mode due to chromatic waveguide dispersion.

Without intending to be bound by theory, some illustrative examples will be described using an athermal condition associated with reduced sensitivity to temperature changes (which does not necessarily strictly apply for all implementations and all operating ranges of the techniques described herein). To obtain the athermal condition, we differentiate Eq. (1) with respect to temperature and set the derivative to zero. A change of variable to $X \equiv \sin(\theta)$ leads to:

$$\frac{dX}{dT} = \frac{\partial n_E}{\partial T} + \frac{\partial n_E}{\partial \lambda_L}\frac{\partial \lambda_L}{\partial T} - \frac{1}{\Lambda_E}\frac{\partial \lambda_L}{\partial T} \quad (2)$$

Using $$n_{g,E} = n_E - \lambda_L \frac{\partial n_E}{\partial \lambda_L},$$

in which $n_{g,E}$ is the group index of the guided mode in the emitter region, this becomes:

$$\frac{dX}{dT} = \frac{\partial n_E}{\partial T} - \left(\frac{\partial n_E}{\partial \lambda_L} - \frac{1}{\Lambda_E}\right)\frac{\partial \lambda_L}{\partial T} = \frac{\partial n_E}{\partial T} - \left((n_{g,E} - n_E)\frac{1}{\lambda_L} + \frac{1}{\Lambda_E}\right)\frac{\partial \lambda_L}{\partial T} \quad (3)$$

If the temperature dependence of the output angle is to be completely eliminated, $dX/dT$ should be equal to zero, which yields:

$$\frac{\partial n_E}{\partial T} = \left((n_{g,E} - n_E)\frac{1}{\lambda_L} + \frac{1}{\Lambda_E}\right)\frac{\partial \lambda_L}{\partial T} \quad (4)$$

where the first term on the right is due to chromatic waveguide dispersion and the second term depends on the fixed emission angle. Thus far, the athermal condition specified by Eq. (4) is for a general case that applies to any of a variety of different laser cavity configurations. In the special case of a loosely guided mode, for which the dispersion is negligible ($n_{g,E} \approx n_E$), Eq. (4) simplifies to:

$$\Lambda_E \frac{\partial n_E}{\partial T} = \frac{\partial \lambda_L}{\partial T} \approx 2\Lambda_L \frac{\partial n_L}{\partial T} \quad (5)$$

where in the second equality we have substituted in $\lambda_L \approx 2\Lambda_L n_L$, for the specific case of a grating-based laser filter. From the above equation it can be concluded that the athermal condition depends on the angle of emission, which is determined by the period of the emitter grating ($\Lambda_E$). For the case of perfectly vertical emission, $\theta = 0$ and $\Lambda_E = \lambda_L/n_E$ from Eq. (1), and using $\Lambda_L \approx 2\Lambda_L n_L$ the athermal condition is given by:

$$\frac{1}{n_E}\frac{\partial n_E}{\partial T} = \frac{1}{n_L}\frac{\partial n_L}{\partial T} \Rightarrow \frac{\delta n_E}{n_E} = \frac{\partial n_L}{n_L} \quad (6)$$

In this situation, this means that if the percentage of index change in the laser grating and optical antenna grating waveguides is equal, temperature deviations do not shift the emission from its vertical direction (at least for small changes in temperature).

One example implementation makes the laser grating and optical antenna grating near-identical. In this example, the grating strengths are optimized for optimal laser grating reflectivity and optical antenna grating output coupling separately. In order to ensure that Eq. (4) is satisfied, the laser and optical antenna grating system can be configured using certain combinations of one or more of: the material stack-up (e.g., choice of materials used based on their thermo-optic coefficients, and/or lengths and waveguide dimensions of those materials), total round-trip length of the laser, grating dimensions, and/or grating pitch. In some implementations, some of these parameters may be constrained by other design considerations, so remaining parameters can be used to ensure that Eq. (4) is sufficiently satisfied to a desired degree of precision. In some implementations, the laser and optical antenna grating periods are a multiple of each other. For example, the optical antenna grating can diffract light according to the first diffraction order and the laser grating can reflect light according to the first diffraction order. In this case the laser grating pitch will be half of the optical antenna grating pitch. Nonetheless, the laser grating and optical antenna grating can reflect and diffract light according to any diffraction order. Furthermore, they don't need to be continuous or have the same sampling period. For example, the laser grating can be a sampled grating while the optical antenna grating can be continuous.

Figure 3:
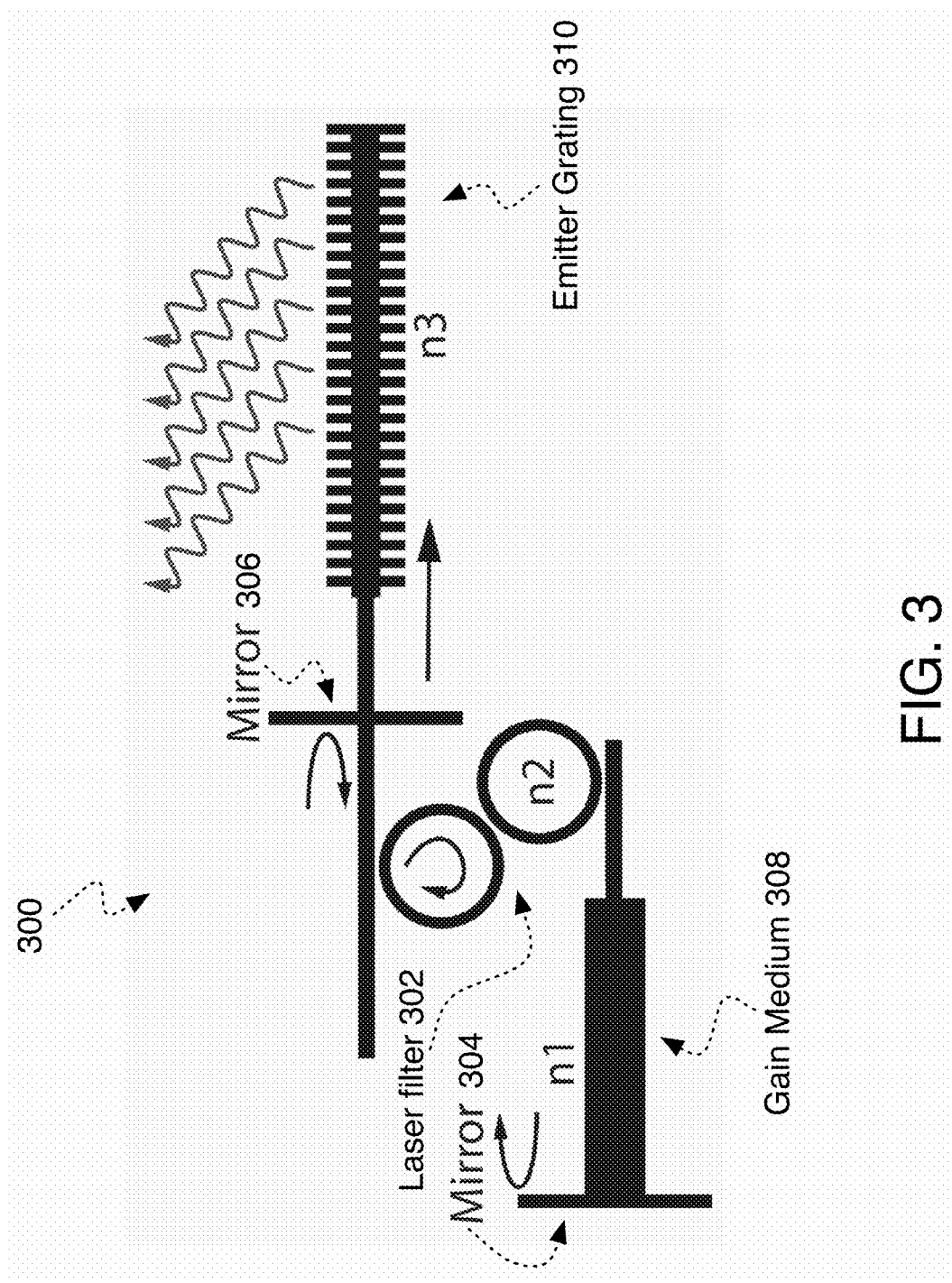
FIGS. 3, 4A, and 4B are schematic diagrams of a laser and optical antenna grating system.

Another example implementation of a laser and optical antenna grating system 300 is shown in FIG. 3, in which a laser filter 302 comprises an intracavity ring (or "racetrack") resonator implemented using waveguides formed into closed circular paths and positioned to couple laser light between cavity mirrors 304 and 306. The system 300 also includes an emitter grating 310 receiving light from the laser. Different material segments of the system 300 have different effective refractive indices, such as: $n_1$, $n_2$, and $n_3$, associated with the laser gain medium 308, laser filter 302, and emitter grating 310, respectively. In this case, the laser wavelength is determined by the filter resonance condition, $\beta_r L_{rt} = m2\pi$, where $L_{rt}$ is the round-trip length of the laser filter 302 (e.g., $L_{rt} = 2\pi R$ in the case of a full trip around a ring of radius R, or in the case multiple rings as in the illustrated example the full optical path length traversed through each ring in a round-trip of the full laser cavity), $\beta_r = 2\pi n_r/\Lambda_L$ is the propagation constant inside the laser filter 302, and m is an integer. The laser wavelength is then given by $\Lambda_L = L_{rt} n_r/m$, where $n_r = n_2$ is the effective refractive index in the waveguides of the filter 302. To obtain the athermal condition for such a system 300, we simply substitute this expression for $\Lambda_L$ into Eq. (4):

$$\frac{\partial n_E}{\partial T} = \left( (n_{g,E} - n_E) \frac{1}{n_r} + \frac{L_{rt}}{m\Lambda_E} \right) \frac{\partial n_r}{\partial T} \quad (7)$$

Figure 4A:
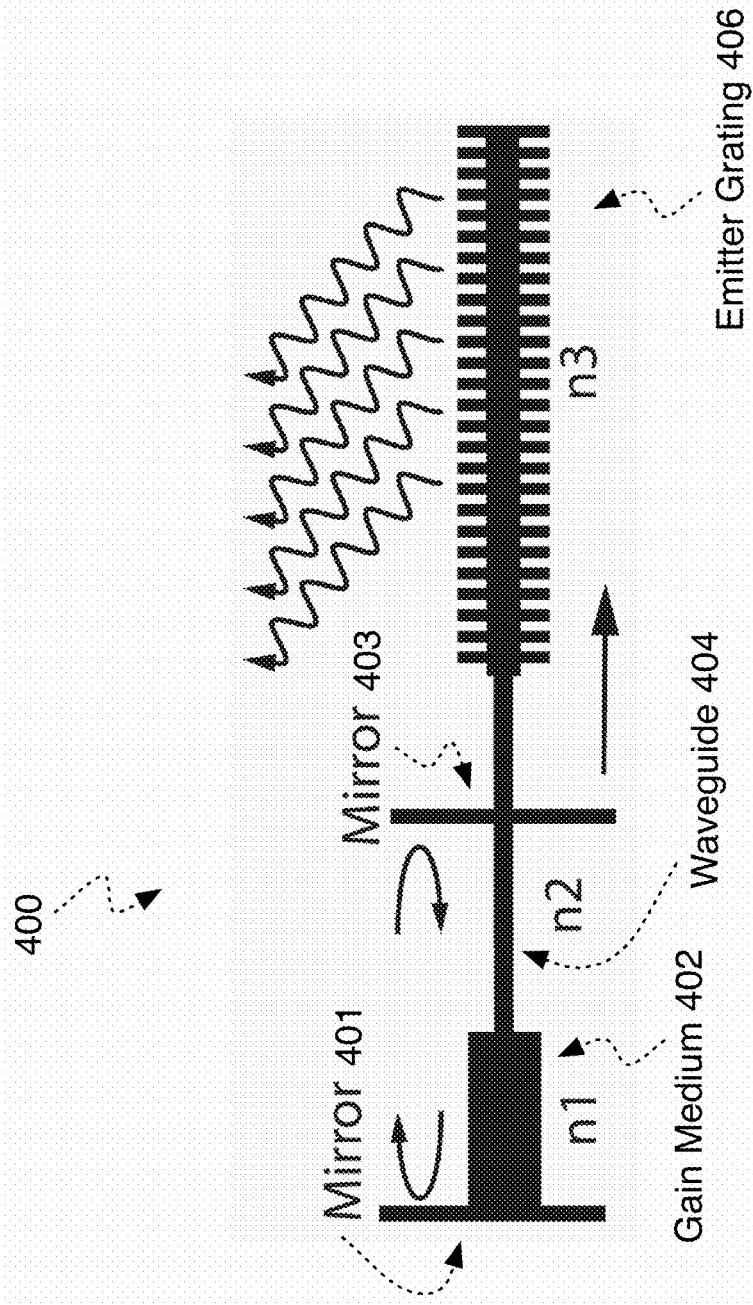
Figure 4B:
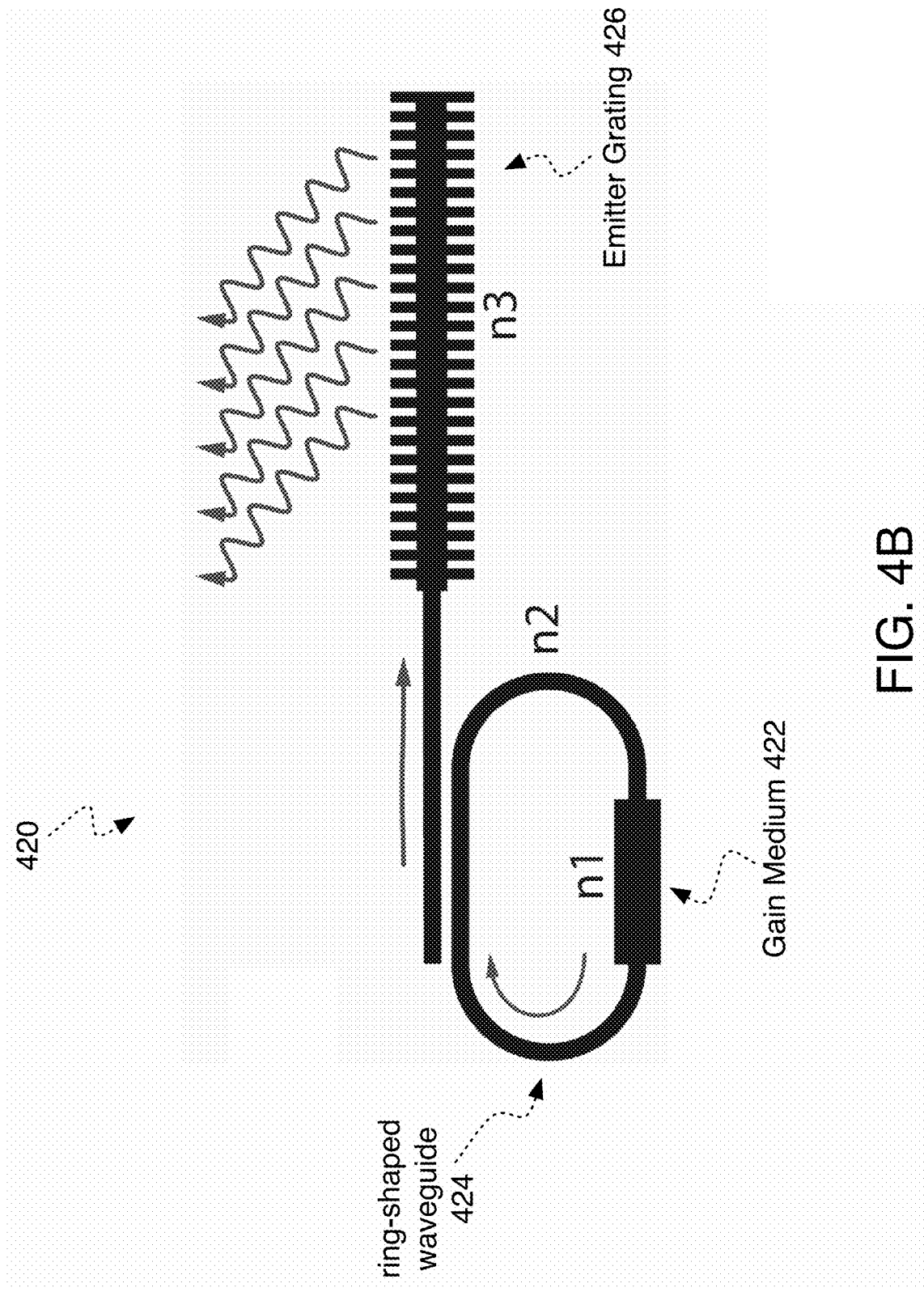

The athermalization technique can also be applied to a laser and optical antenna grating system in which the laser does not contain any form of wavelength-dependent filter, and the operating wavelength is determined simply by the resonant modes of the laser cavity. In this case, we can imagine the laser cavity as being comprised of several different segments with different constituent materials and lengths, such that the round-trip phase accumulated by light in the cavity is given by:

$$\phi_{rt} = 2 \sum_i \beta_i L_i \quad (8)$$

where $\beta_i$ is the propagation constant of segment i and $L_i$ is the (single-pass) length of segment i, and i varies over the number of segments within the laser cavity. In this example, we have used an example of a linear cavity with light reflected on a round-trip path between mirrors 401 and 403 in a system 400, as shown in FIG. 4A. Alternatively, for a ring-shaped laser cavity in a system 420 (shown in FIG. 4B), a similar result holds, but the factor of two on the right hand side of Eq. (8) is absent. Each of these system configurations also include three different material segments that have different effective refractive indices. The system 400 includes effective refractive indices: $n_1$, $n_2$, and $n_3$, associated with the laser gain medium 402, internal waveguide 404, and emitter grating 406, respectively. The system 420 includes effective refractive indices: $n_1$, $n_2$, and $n_3$, associated with the laser gain medium 422, internal ring-shaped waveguide 424, and emitter grating 426, respectively. Similar to the case described above, the operating wavelength of the laser is then given by:

$$\lambda_L = \frac{2}{m} \sum_i n_i L_i \quad (8)$$

where $n_i$ is the effective refractive index of the mode in the $i^{th}$ material segment that is internal to the laser cavity. The athermal condition for this case can similarly be obtained by substituting this expression from Eq. (8) into Eq. (4). Generally, the laser operating wavelength(s) (i.e., the wavelength(s) at which the round-trip gain overcomes the round-trip loss so that the laser is above a lasing threshold) are determined based on Eq. (8). The optional presence of a laser filter, in some implementations, forces a certain value or subset of values for the mode number m, which corresponds to the wavelength for which the round-trip net gain for the cavity is highest, which in most situations will be the wavelength closest to the center wavelength of the filter. So, for implementations in which a laser filter is present, the center wavelength of the laser filter can be used to determine the laser operating wavelength(s). In implementations in which no laser filter is present, the laser operating wavelength is less strictly determined—the laser will operate wherever the net gain is highest, but often there will be several values of m that correspond to wavelengths with comparable net gain, and the laser will be multimode.

Examples of simulated and experimental results illustrating performance of the laser/antenna compensation techniques described herein will be described with reference to additional figures.

Figures 5A, 5B:
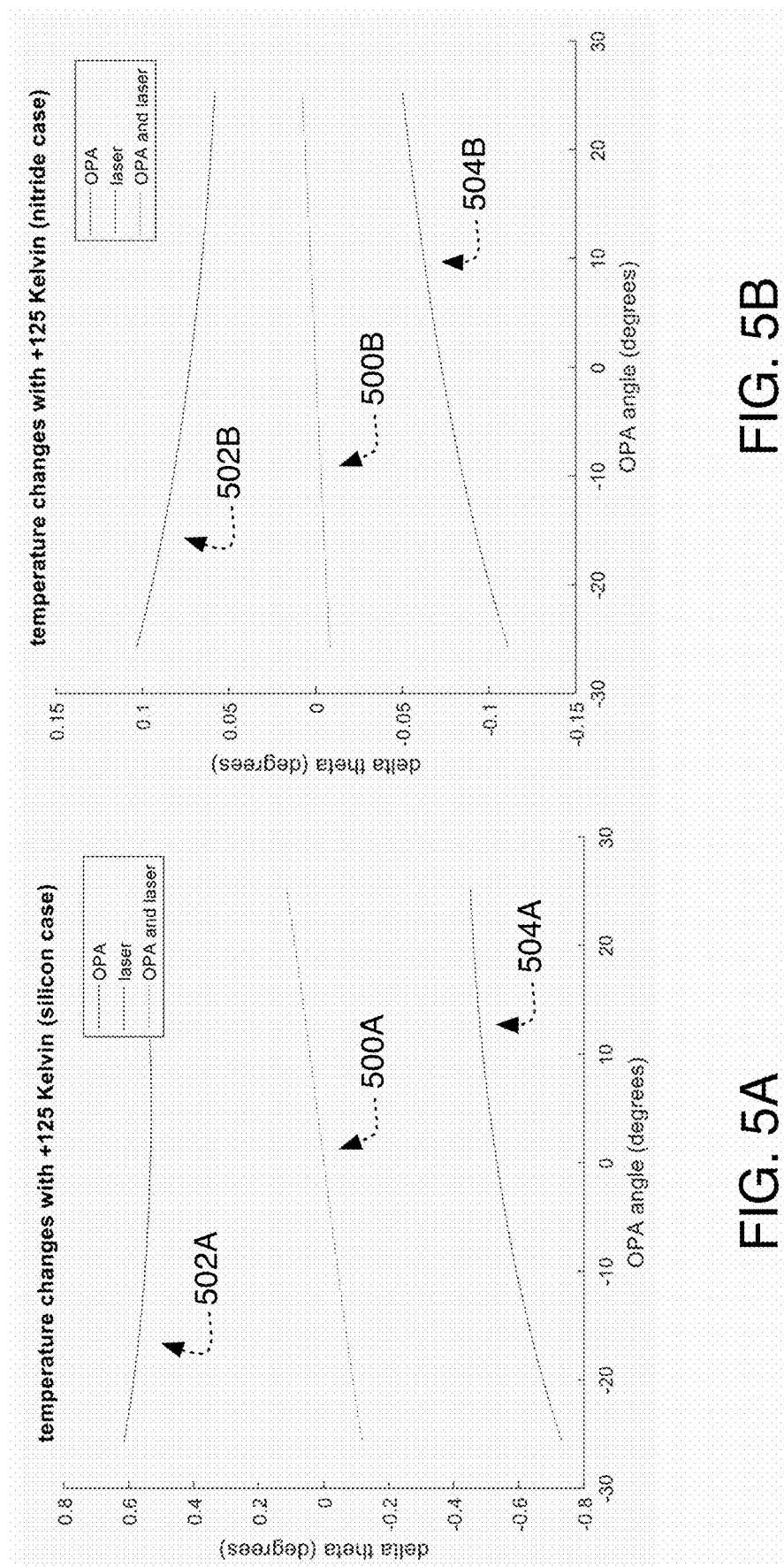
FIGS. 5A and 5B are plots of angle change vs angle for a simulated temperature change in a silicon and silicon nitride waveguide, respectively.

FIGS. 5A and 5B show the change in the simulated beam output angle for a 125 Kelvin temperature change between low and high temperatures around a nominal center temperature. FIG. 5A shows simulated results for the case when the laser and emitter gratings are based on a silicon core waveguide surrounded by oxide, and FIG. 5B shows simulated results for the case when the laser and emitter gratings are based on silicon nitride core waveguide surrounded by oxide. The simulated change in the output angle ("delta theta") plotted as a function of the output angle of the OPA ("OPA angle") in units of degrees. A plot 502A shows the output angle change due to the effect of the temperature change on the optical antenna grating alone, which is about +0.6 degrees. A plot 504A shows the output angle change due to the effect of the temperature change on the laser alone (i.e., a resulting wavelength shift), which is about −0.6 degrees. A plot 500A shows the combined result of the total effects of the temperature change on the output angle, which is about zero degrees for perfectly vertical emission (OPA angle of zero), and is reduced significantly for near vertical emission (e.g., between about −30 to +30 degrees). Similar simulation plots 500B (total effects), 502B (optical antenna grating alone), and 504B (laser alone) are shown for the nitride based grating case, which is less dependent on temperature due to the lower thermo-optic coefficient of silicon nitride versus silicon and the reduced diffractive power of the grating.

Figure 6:
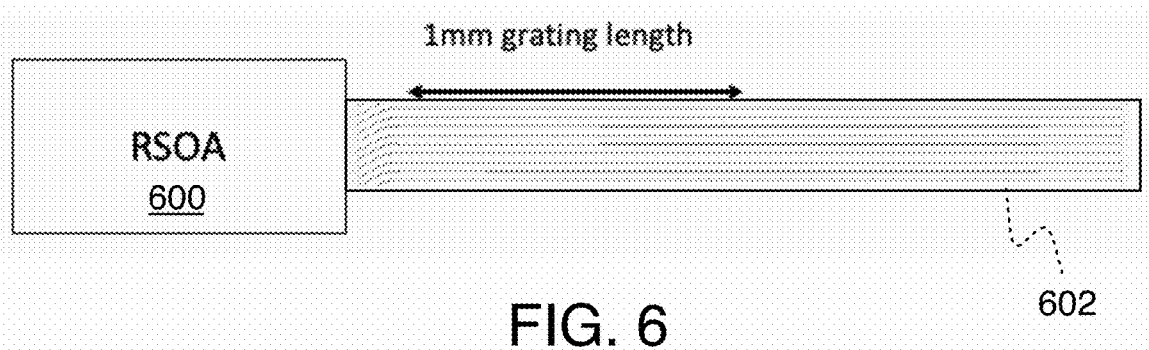
FIG. 6 is a schematic diagram of an example laser structure formed from a reflective semiconductor optical amplifier and a silicon photonic chip.
Figure 7:
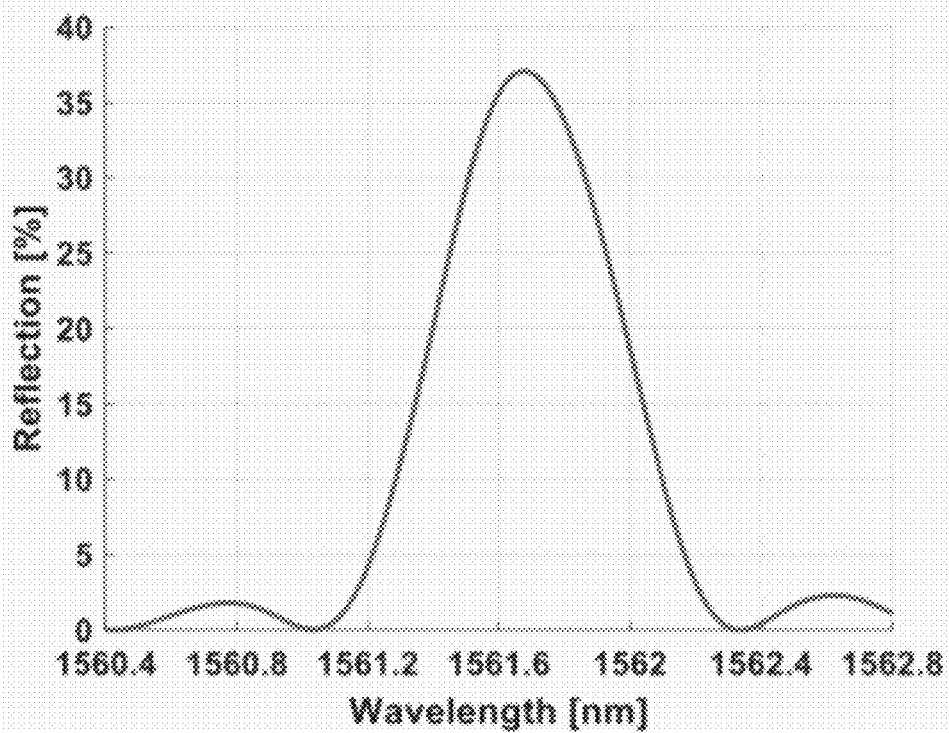
FIG. 7 is a plot of a reflection profile for the example laser structure.

FIG. 6 shows an example of a laser structure fabricated to demonstrate quantitative test results illustrating some of the techniques described herein. A III/V reflective semiconductor optical amplifier (RSOA) 600 is butt-coupled to a polished facet of a silicon photonic chip 602 that provides a laser grating. The laser grating is formed, in this example, using corrugated sidewalls. FIG. 7 shows the resulting reflection profile as a function of wavelength, which has a 37% peak reflectivity at a nominal temperature. The laser wavelength of this example laser structure shifts as the silicon photonic chip 602 is heated due to associated changes in the laser grating.

Figure 8:
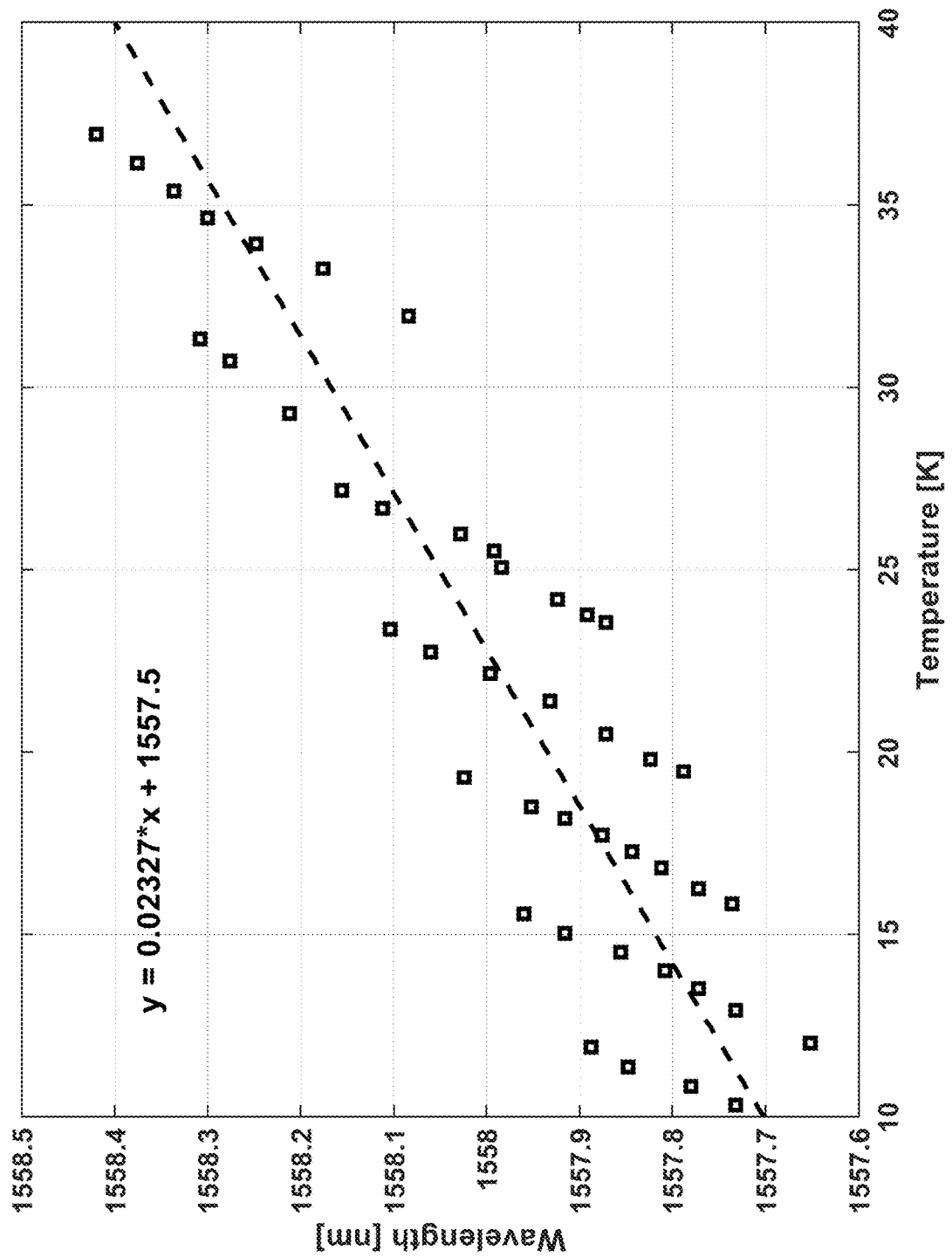
FIG. 8 is a plot of wavelength vs. temperature.

FIG. 8 shows a plot of wavelength as a function of temperature from experimental results using this example laser structure. The laser cavity for this laser structure is in the form of a Fabry-Pérot cavity made up of the reflective surface at the left end of the RSOA 600 and the grating reflector in the silicon photonic chip 602. The mode spacing of the Fabry-Pérot cavity depends on the effective length of the cavity, and in this case the mode spacing is 0.3 nm. As the grating full-width at half maximum (FWHM) reflection band is 0.6 nm wide, at each moment in time, one or more resonant modes exist, and laser conditions are met. As the temperature of the thermal environment changes, the wavelength of the laser increases with relatively large slope. Due to mode hopping, when the Fabry-Pérot mode moves faster than the grating wavelength, another cavity mode appears and becomes the dominant lasing mode. Therefore, the wavelength of the laser on average moves with a slower slope of 0.023 nm/° C.

Figure 9:
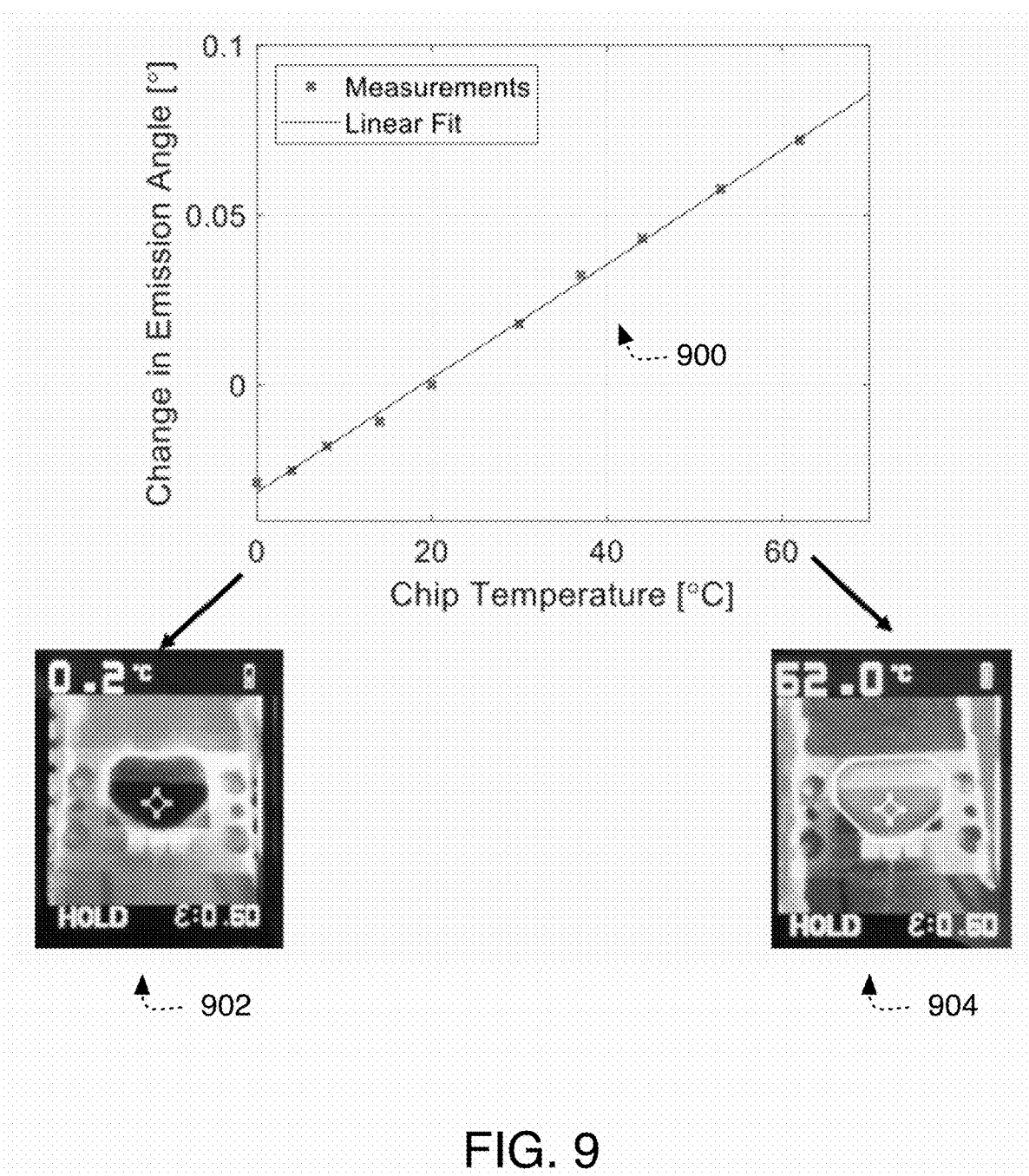
FIG. 9 is a plot and images showing change in emission angle vs. temperature.

Referring to FIG. 9, the change in beam emission angle from an emitter grating that is coupled to this example laser structure in a chip providing a common thermal environment is measured as a function of temperature of that chip, with experimental measurements being plotted against a computed linear fit 900. Using a camera to monitor the beam angle, example images 902 and 904 are shown for temperatures of 0.2° C. and 62.0° C., respectively.

Figures 10A, 10B, 10C:
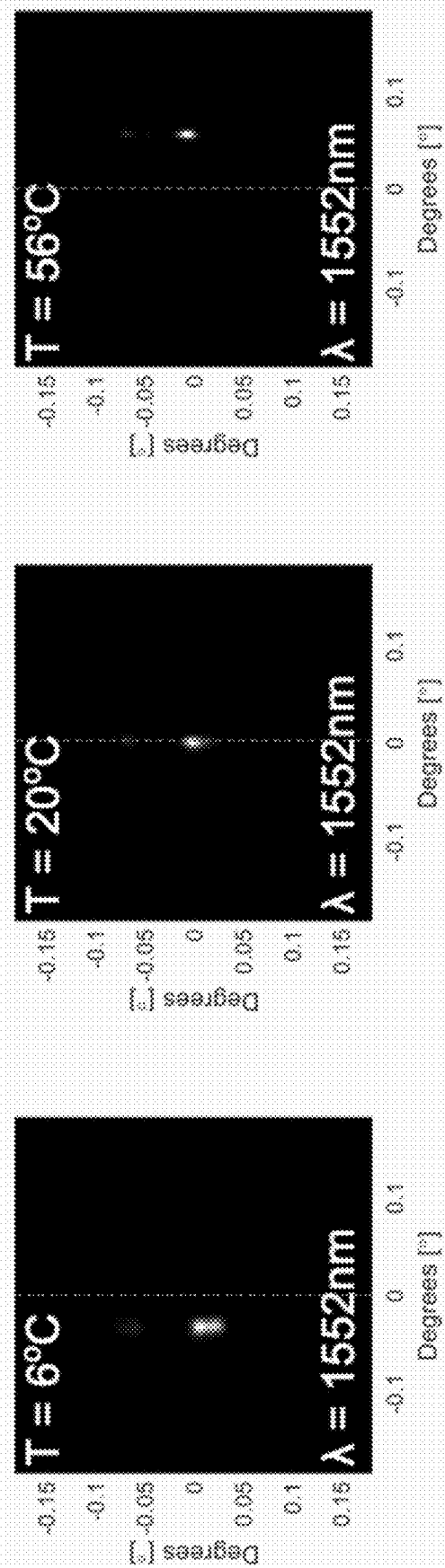
FIGS. 10A-10C are images showing beam emission for a system configuration without laser/emitter compensation.

The combined effect of the temperature change in the laser structure and the coupled emitter grating is summarized in FIGS. 10A-10F showing two dimensional images showing beam emission angle for different temperatures and different system configurations. FIGS. 10A-10C show effects of temperature change on emission angle without a common thermal environment in which the laser grating and the emitter grating share a common temperature. FIGS. 10D-10F show effects of temperature change on emission angle with a common thermal environment in which the laser grating and emitter grating share a common temperature. As shown in FIGS. 10A (T=6° C.), 10B (T=20° C.), and 10C (T=56° C.), if there is no common thermal environment to provide a common temperature, and therefore reduce the thermal steering, when the temperature is reduced the resulting wavelength change is not compensated and the beam emission angle steers to the left. Whereas, as shown in in FIGS. 10D (T=6° C.), 10E (T=20° C.), and 10F (T=56° C.), with the common thermal environment enabling the laser/emitter compensation, even when the temperature change leads to a change in the wavelength of the laser, the beam emission angle does not steer significantly in either direction.

The compensation techniques described herein are not limited to grating-based lasers. The wavelength-dependent laser filter that is part of the laser can also be implemented using any of a variety of components, such as a micro-ring resonator, combination of micro-ring and grating, echelle grating, arrayed waveguide grating, Mach-Zehnder interferometer, multi-mode interferometer, . . . etc. Any combination of these laser filters (some of which may serve as laser cavity reflectors) is also possible. In any of these implementations, the temperature dependent wavelength shift of the laser filter compensates for the angular shift of the antenna grating as a function of temperature.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An optical device comprising:
a laser gain medium;
an internal laser component comprising:
a waveguide that defines a guided mode of a first optical wave,
wherein the first optical wave is characterized by a first propagation constant associated with a first effective refractive index; and
an optical antenna grating, the optical antenna grating comprising:
a waveguide that defines a guided mode of a second optical wave, and
a grating structure configured to emit a portion of the second optical wave from the optical antenna grating in a selected direction,
wherein the second optical wave is characterized by a second propagation constant associated with a second effective refractive index;
wherein the internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

2. The optical device of claim 1, wherein the internal laser component further comprises a laser filter structure configured to reflect or transmit a portion of the first optical wave to propagate through the laser gain medium.

3. The optical device of claim 2, wherein the laser filter structure comprises a laser grating.

4. The optical device of claim 3, wherein the laser grating comprises a cavity reflector of a laser cavity that circulates the first optical wave through the laser gain medium.

5. The optical device of claim 3, wherein a common grating structure comprises both a grating structure of the laser grating and the grating structure of the optical antenna grating.

6. The optical device of claim 3, wherein a grating structure of the laser grating and the grating structure of the optical antenna grating are physically separate structures.

7. The optical device of claim 6, wherein the optical antenna grating is outside a laser device that comprises the laser gain medium and the laser grating.

8. The optical device of claim 7, wherein a period of the grating structure of the optical antenna grating is approximately a multiple of a period of a grating structure of the laser grating.

9. The optical device of claim 8, wherein the period of the grating structure of the optical antenna grating is approximately twice the period of the grating structure of the laser grating.

10. The optical device of claim 3, wherein the relationship between the first effective refractive index and the second effective refractive index is approximately given by $$\Lambda_2 \frac{\partial n_2}{\partial T} = 2\Lambda_1 \frac{\partial n_1}{\partial T}$$

where $n_1$ is the first effective refractive index, $n_2$ is the second effective refractive index, $\Lambda_1$ is a period of the grating structure of the laser grating, $\Lambda_2$ is a period of the grating structure of the optical antenna grating, and T is the temperature of the thermal environment.

11. The optical device of claim 2, wherein the laser filter structure comprises at least one ring resonator in a laser cavity that includes the laser gain medium.

12. The optical device of claim 1, wherein the internal laser component comprises at least one segment of a material in a laser cavity that includes the laser gain medium.

13. The optical device of claim 1, wherein the selected direction is substantially insensitive to a change in a temperature of the thermal environment due to a temperature dependent change in the selected direction associated with the optical antenna grating being at least partially compensated by a temperature dependent wavelength shift in the optical device associated with the laser filter.

14. The optical device of claim 1, wherein the selected direction is substantially perpendicular to a direction of propagation of the second optical wave within the optical antenna grating.

15. A method of fabricating an optical device, the method comprising:
    forming a laser gain medium;
    forming an internal laser component comprising:
        a waveguide that defines a guided mode of a first optical wave,
        wherein the first optical wave is characterized by a first propagation constant associated with a first effective refractive index; and
    forming an optical antenna grating, the optical antenna grating comprising:
        a waveguide that defines a guided mode of a second optical wave, and
        a grating structure configured to emit a portion of the second optical wave from the optical antenna grating in a selected direction,
        wherein the second optical wave is characterized by a second propagation constant associated with a second effective refractive index;
    wherein the internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

16. A method of operating an optical device, the method comprising:
    pumping a laser gain medium;
    coupling a first optical wave between an internal laser component and the laser gain medium, the internal laser component comprising:
        a waveguide that defines a guided mode of the first optical wave,
        wherein the first optical wave is characterized by a first propagation constant associated with a first effective refractive index; and
    emitting a portion of a second optical wave from an optical antenna grating, the optical antenna grating comprising:
        a waveguide that defines a guided mode of the second optical wave, and
        a grating structure configured to emit the portion of the second optical wave from the optical antenna grating in a selected direction,
        wherein the second optical wave is characterized by a second propagation constant associated with a second effective refractive index;
    wherein the internal laser component and the optical antenna grating are configured to provide a relationship between the first effective refractive index and the second effective refractive index such that the selected direction is substantially insensitive to a change in a temperature of a thermal environment in which the internal laser component and the optical antenna grating are thermally coupled.

17. The method of claim 15, further comprising forming on the internal laser component a laser filter structure configured to reflect or transmit a portion of the first optical wave to propagate through the laser gain medium.

18. The method of claim 17, wherein the laser filter structure comprises a laser grating.

19. The method of claim 18, wherein the relationship between the first effective refractive index and the second effective refractive index is approximately given by $$\Lambda_2 \frac{\partial n_2}{\partial T} = 2\Lambda_1 \frac{\partial n_1}{\partial T}$$

where $n_1$ is the first effective refractive index, $n_2$ is the second effective refractive index, $\Lambda_1$ is a period of the grating structure of the laser grating, $\Lambda_2$ is a period of the grating structure of the optical antenna grating, and T is the temperature of the thermal environment.

20. The method of claim 15, wherein the selected direction is substantially insensitive to a change in a temperature of the thermal environment due to a temperature dependent change in the selected direction associated with the optical antenna grating being at least partially compensated by a temperature dependent wavelength shift in the optical device associated with the laser filter.

21. The method of claim 16, wherein the internal laser component further comprises a laser filter structure configured to reflect or transmit a portion of the first optical wave to propagate through the laser gain medium.

22. The method of claim 21, wherein the laser filter structure comprises a laser grating.

23. The method of claim 22, wherein the relationship between the first effective refractive index and the second effective refractive index is approximately given by $$\Lambda_2 \frac{\partial n_2}{\partial T} = 2\Lambda_1 \frac{\partial n_1}{\partial T}$$

where $n_1$ is the first effective refractive index, $n_2$ is the second effective refractive index, $\Lambda_1$ is a period of the grating structure of the laser grating, $\Lambda_2$ is a period of the grating structure of the optical antenna grating, and T is the temperature of the thermal environment.

24. The method of claim 16, wherein the selected direction is substantially insensitive to a change in a temperature of the thermal environment due to a temperature dependent change in the selected direction associated with the optical antenna grating being at least partially compensated by a temperature dependent wavelength shift in the optical device associated with the laser filter.

* * * * *